United States Patent [19]
Tao

[11] Patent Number: 5,578,512
[45] Date of Patent: Nov. 26, 1996

[54] POWER MESFET STRUCTURE AND FABRICATION PROCESS WITH HIGH BREAKDOWN VOLTAGE AND ENHANCED SOURCE TO DRAIN CURRENT

[75] Inventor: Kung-Chung Tao, Hsingchu City, Taiwan

[73] Assignee: Industrial Technology Research Institute, Hsinchu, Taiwan

[21] Appl. No.: 401,017

[22] Filed: Mar. 8, 1995

Related U.S. Application Data

[62] Division of Ser. No. 116,918, Sep. 7, 1993, abandoned.
[51] Int. Cl.$^6$ .................... H01L 21/265; H01L 21/44; H01L 21/338
[52] U.S. Cl. .............. 437/39; 437/44; 437/175; 437/912
[58] Field of Search ................. 437/39, 405 H, 437/415 H, 44, 45, 75, 176, 912; 148/DIG. 82, DIG. 139, DIG. 140

[56] References Cited

U.S. PATENT DOCUMENTS

| | | | |
|---|---|---|---|
| 4,694,563 | 9/1987 | Kikuchi | 437/40 SH |
| 4,698,899 | 10/1987 | Kakihana | 437/41 SH |
| 4,729,372 | 3/1988 | L'Esperance, Jr. | |
| 4,753,899 | 6/1988 | Colquhoun | 437/176 |
| 4,941,093 | 7/1990 | Marshall et al. | |

FOREIGN PATENT DOCUMENTS

| | | |
|---|---|---|
| 0417952A2 | 3/1991 | European Pat. Off. |
| WO92/00711 | 1/1992 | WIPO |

*Primary Examiner*—Mary Wilczewski
*Assistant Examiner*—Brian K. Dutton
*Attorney, Agent, or Firm*—Bo-In Lin

[57] ABSTRACT

The present invention comprises a metal semiconductor field effect transistor (MESFET) 100. The MESFET 100 comprises a semiconductor substrate 110 composed of gallium arsenide (GaAs) which has a top surface. This MESFET transistor 100 further comprises a contiguous first conductivity type source area 165, gate area 164, and drain area 170 disposed near the top surface on the semiconductor substrate 110, wherein the source and drain areas 165 and 170 respectively are of an equal relatively large depth from the top surface with high doping concentration. The gate area 164 is of a relatively small depth from the top surface. The gate area 164 is further disposed between and extending thereunto the source area 165 and the drain area 170. The gate area 164 further includes a current enhancement region 155 being doped with ions of the first conductivity with relatively lower concentration and extending between the gate area 164 and the source area 165. The current enhancement region 155 is a region of less depth from the top surface doped with a depletion implantation and an enhancement implantation. The gate area 164 further includes a breakdown prevention region doped with a depletion implantation which a relatively less ion concentration of the first conductivity. The breakdown prevention region extends between the gate area 160 and the drain area 170.

1 Claim, 5 Drawing Sheets

POWER MESFET STRUCTURE AND FABRICATION PROCESS WITH HIGH BREAKDOWN VOLTAGE AND ENHANCED SOURCE TO DRAIN CURRENT

The is a divisional application of a prior application of Ser. No. 08/116,918 filed on Sep. 7, 1993, now abandoned.

BACKGROUND OF THE INVENTION

1. Field of the Invention

This invention relates generally to the structure and fabrication process of gallium arsenide (GaAs) integrated circuits (ICs). More particularly, this invention relates to the structure and fabrication process of GaAs power metal semiconductor field effect transistor (MESFET) integrated circuits (ICs) which has high breakdown voltage and high drain source current (Ids).

2. Description of the Prior Art

Application of the conventional general purpose GaAs MESFET as a power MESFET has two basic limitations. The first limitation is the low level of breakdown voltage and the second limitation is the low drain to source current. The drain to source breakdown voltage depends heavily on the basic FET structure including the configuration and the relative positioning of the cross section of the channel regions while the gate breakdown voltage is closely related to the carrier concentration of the active layer and the pinch off voltage which in turn is related to the drain saturation current per unit gate width.

Because of the inter-dependencies between these structure parameters, in order to overcome the aforementioned limitations, various types of GaAs FET structures and IC processing methods are investigated. FIG. 1 shows a cross-sectional view of a general purpose MESFET IC 10 wherein three types of MESFET structures 20, 30 and 40 are supported on a semi-insulating GaAs substrate 50. Each of these structures has a source, i.e., 22, 32, 42, a gate, i.e. 24, 34, and 44, and a drain, i.e., 26, 36, and 46. Under these sources and the drains, these three MESFET structures all have highly doped and deep N-plus regions, regions 27, 37 and 47. Between the N-plus regions under the source and drain, i.e., regions 27, 37, and 47, all three structures also have a shallower active channel region, i.e., regions 28, 38, and 48, which extends partially into these deeper N-plus regions, i.e., regions 27, 37, and 47.

The only difference between these three structures 20, 30 and 40, are the dopant concentrations of the shallower active channels as represented by regions 28, 38, and 48. In the first structure 20, the region 28 is a depletion and enhancement channel, in the second structure 30, the region 38 is an enhancement channel, and in the third structure 40, the region 48 is a depletion channel. As disclosed by TriQuint in 'TQS GaAs QED/A Design Manual' Version 3.0 Rev. -, October. 1991, the relative quantity of the breakdown voltages and drain-source currents are shown in Table 1 below:

TABLE 1

| Structure | Implantation | Breakdown Voltage | Ids |
|---|---|---|---|
| E-FET | Enhancement Implantation | High | Low |
| D-FET | Depletion Implantation | High | Medium |
| M-FET | Enhancement and Depletion | Low | High |

These FET structures illustrate that when the active channel under the gate, i.e., regions 28,38, and 48, have lower concentration of dopant, i.e., the E-FET and D-FET types of structures, there is a higher breakdown voltage. However, the lower concentration of dopant in these type of structures also causes the source-drain current to decrease. There seems to have a conflict between these two design parameters with these conventional types of structures that the breakdown voltage and the source to drain current can not be increased simultaneously.

Codella et al. disclose in U.S. Pat. No. 4,632,822 a self aligned GaAs, lightly doped drain MESFET wherein a shallow N-minus (N–) active channel region formed on a GaAs substrate, a Schottky gate overlaying the N– region and highly doped and deep N+ source and drain regions formed on either side of the gate. In the channel region between the gate edges and the source/drain are positioned n-type source/drain extensions which have intermediate depth and doping concentration to minimize the device series resistance, suppress short channel effects and permit channel length reduction to sub micron levels. In another embodiment, Codella et al. also disclose a structure where a deep p-type pockets are formed under the source/drain extensions to better control the device threshold voltage and to further reduce the channel.

The GaAs MESFET self-aligned structure as disclosed by Codella is able to reduce the series resistance and shorten the channel length by the use lightly doped source/drain extensions which diminishes the short channel effects by preventing the drain electric field to extend into the active channel underneath the gate. However, for the purpose of providing a power MESFET, the dopant concentration of the lightly doped region in the gate extension areas is too low to generate a high drain-source current as required by the power GaAs MESFET.

F. Hasegawa discloses in 'GaAs FET Principle and Technology' (Artech House 1982), that the breakdown voltage can be increased by a FET structure where the active channel region is recessed. FIG. 2 represents such an structure where a cross sectional view of the proposed FET structure 70 is shown. The IC structure is built on a semi-insulating GaAs substrate 75 with an overlaying buffer 80. There is a source 85, a gate 90, and a drain 95 on top of an active channel region 97. There is a gradual recess 99 of the active channel region 97 near the gate 95. This is structure according to Hasegawa will increase the drain breakdown voltage. However, such structure has only limited applications and is not suitable for use in low noise power amplifier which does not provide a solution to overcome the difficulty in implementing GaAs ICs in power MESFET circuits.

Therefore, there is still a need in the art of GaAs power MESFET design and manufacture to provide a structure and fabrication process that would resolve these limitations.

SUMMARY OF THE PRESENT INVENTION

It is therefore an object of the present invention to provide a structure and fabrication process of power MESFET to overcome the aforementioned difficulties encountered in the prior art.

Specifically, it is an object of the present invention to provide a GaAs power MESFET structure and fabrication process that would increase both the breakdown voltage and the drain to source current.

Another object of the present invention is to provide a FET structure and fabrication method to produce GaAs power MESFET with high breakdown voltage and drain to source current without the use of complicate processing steps.

Another object of the present invention is to provide a FET structure and fabrication method to produce GaAs power MESFET with high breakdown voltage and drain to source current where the processing steps are relatively simple and can be reliably repeated.

Briefly, in a preferred embodiment, the present invention comprises a metal semiconductor field effect transistor (MESFET). The MESFET comprises a semiconductor substrate having a top surface. The MESFET further comprises a contiguous source area, gate area, and drain area disposed near the top surface on the semiconductor substrate, wherein the source and drain areas is of an equal relatively large depth from the top surface with high doping concentration. The gate area is of a relatively small depth from the top surface. The gate area is further disposed between and extending thereunto the source area and the drain area. The gate area further includes a current enhancement region with relatively lighter dopant concentration and extends between the gate and the source area.

This invention also discloses a method for fabricating a metal semiconductor field effect transistor (MESFET) which comprises the steps of (a) forming a passivation dielectric layer on top of a semiconductor substrate; (b) forming two-large depth active areas under the dielectric layer by utilizing a photoresist for defining and implanting ions of a first conductivity with higher doping concentration into the active areas wherein one of the active areas being a source area and another a drain area; (c) forming a shallow depth low-doping gate channel by implanting the entire active area using a lower doping concentration with ions of the first conductivity; (d) defining a current enhancement region by employing a photoresist to cover the top surface above the source area and a small portion of contiguous top surface above the gate channel; (e) performing a shallow-depth low concentration enhancement ion implantation for the current enhancement region with ions of the first conductivity; (f) removing the photoresist from the top of the dielectric surface and remove the dielectric layer from a source ohmic contact area, a drain ohmic contact area, and a Schottky gate area; and (g) forming electric contacts on the source ohmic contact area, the drain ohmic contact area, and the Schottky gate area.

It is an advantage of the present invention that it provides GaAs power MESFET structure and fabrication process that would increase both the breakdown voltage and the drain to source current.

Another advantage of the present invention is that it provides a FET structure and fabrication method to produce GaAs power MESFET with high breakdown voltage and drain to source current without the use of complicate processing steps.

Another advantage of the present invention is that it provides a FET structure and fabrication method to produce GaAs power MESFET with high breakdown voltage and drain to source current where the processing steps are relatively simple and can be reliably repeated.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
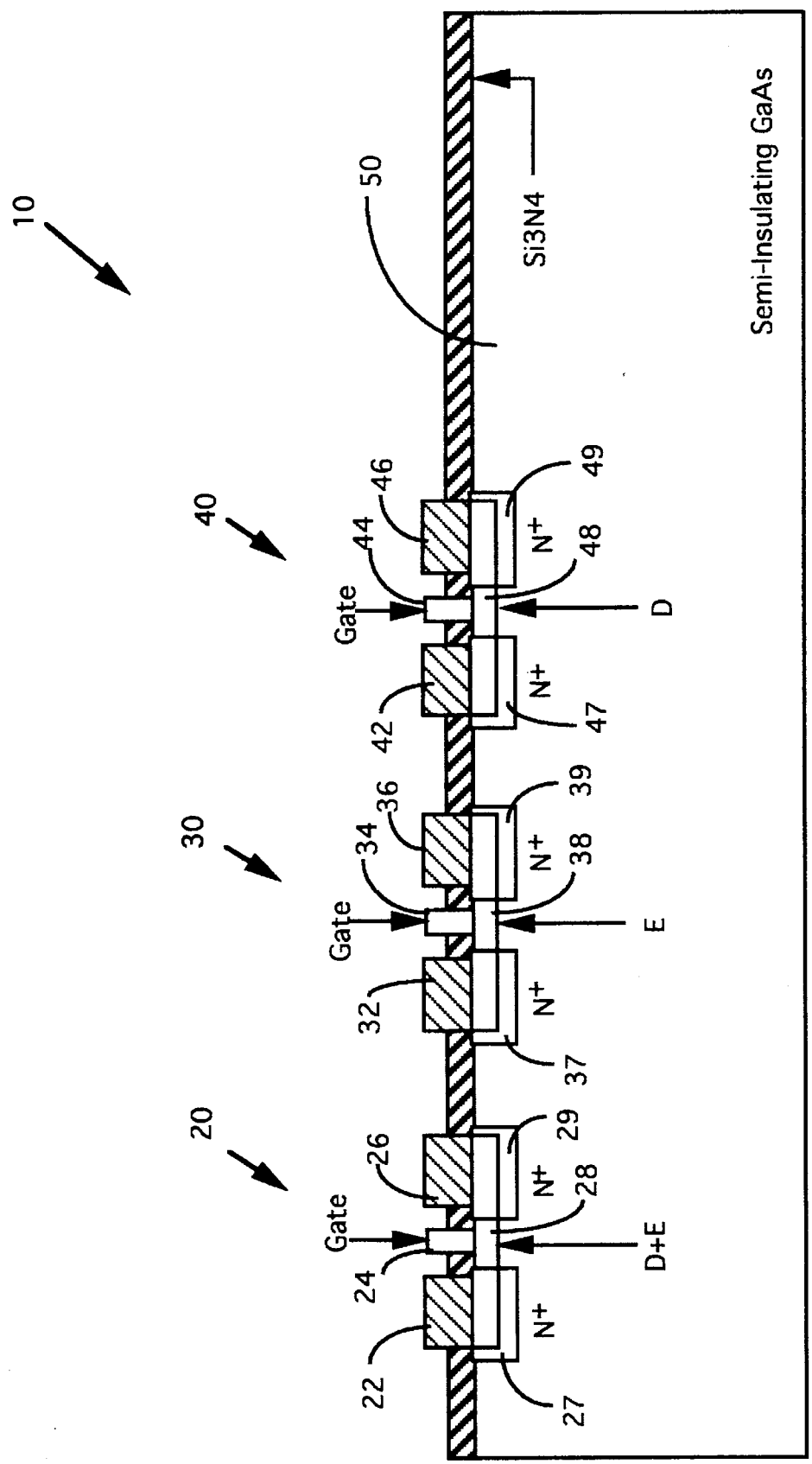
FIG. 1 is a cross-sectional view of a prior art general purpose MESFET IC structure.
Figure 2:
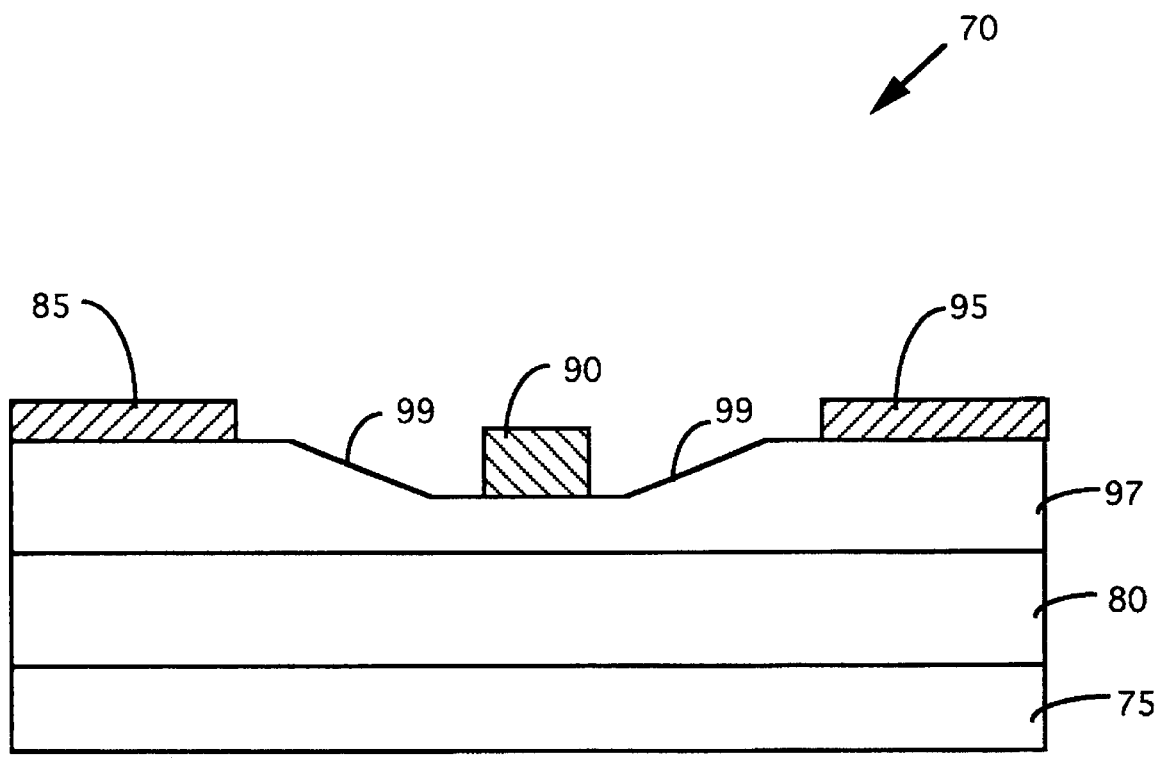
FIG. 2 is a cross-sectional view of another prior art MESFET IC structure.
Figure 3:
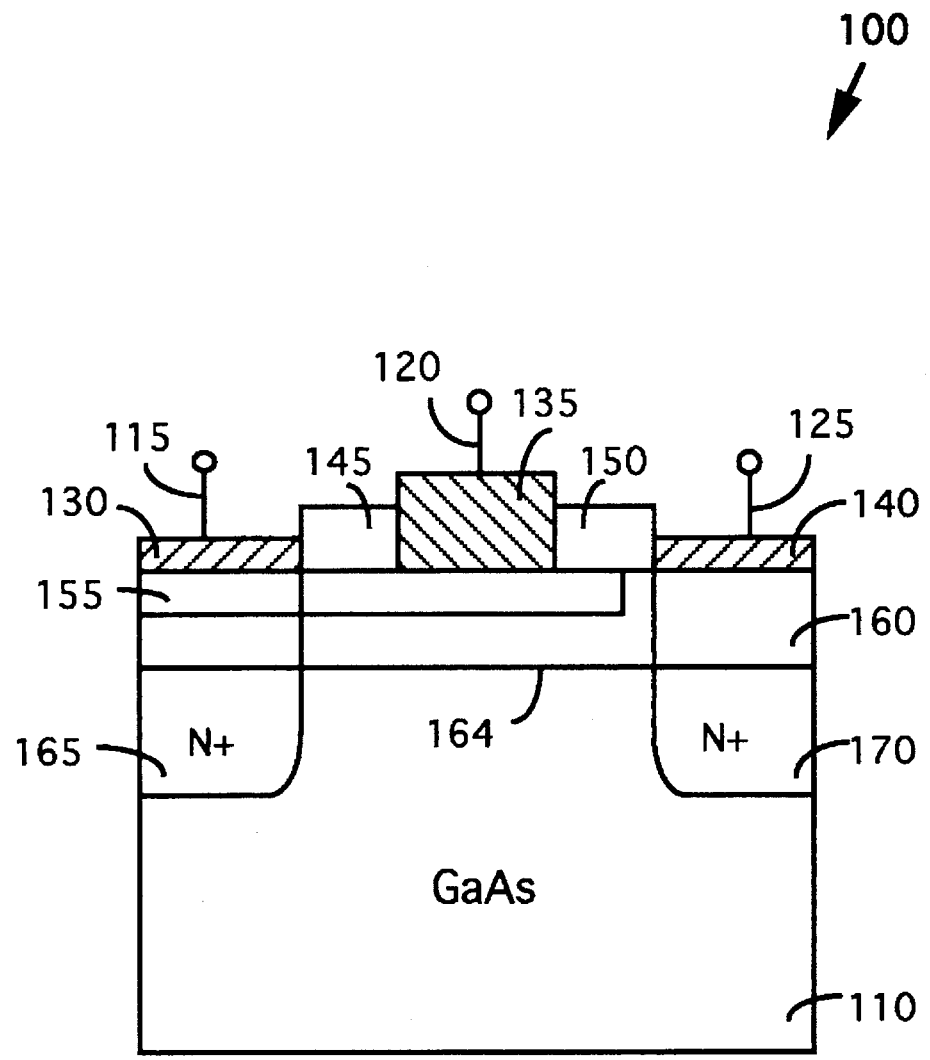
FIG. 3 is a cross-sectional view of a GaAs power MESFET IC structure according to the present invention.

FIG. 3 shows a cross-sectional view of one preferred embodiment of a power GaAs MESFET device 100 in accordance with the principles and the fabrication processes of the present invention. A GaAs substrate 110 is used to support this MESFET device 100 thereon. The MESFET device comprises a source electrode 115, a gate electrode 120 and a drain electrode 125. The ohmic contacts for the source electrode 115 and the drain 125 electrode are 130 and 140 respectively which are composed of AuGeNi compound. The gate Schottky contact 135 is composed of a TiPtAu compound. The source ohmic contact 130 and the drain ohmic contact 145 are separated from the gate Schottky contact 135 by silicon nitride ($Si_3N_4$) barrier 145 and 150 receptively.

Underneath the gate Schottky contact 135, the silicon nitride barrier 145, and the source ohmic contact 130 is an enhancement implanted conducelye region (N–) 155. The region 155 extends slightly to the right beyond the gate Schottky contact 120 and cover a small region beneath the silicon nitride barrier 150. A layer of depletion implanted conductive region (N–) 160 lies underneath the entire length of the MESFET device 100 which extends from a region which is directly underneath the left end of the enhancement implanted conductive region 155 to the right end directly underneath the drain ohmic contact 140. There are two deep N-plus pocket 165 and 170 formed underneath the source ohmic contact 130 and the drain ohmic contact 140 respectively. For convenience of reference, the active channel between the pockets 165 and 170 is referred to as a gate area 164. The gate area 164 comprises partially the depletion implanted region 160 and partially enhancement implanted region 155

This invention thus discloses a metal semiconductor field effect transistor (MESFET) 100 which comprises a semiconductor substrate 110 composed of gallium arsenide (GaAs) which has a top surface. This MESFET transistor 100 further comprises a contiguous source area 165, gate area 164, and drain area 170 disposed near the top surface on the semiconductor substrate 110, wherein the source and drain areas 165 and 170 respectively are of an equal relatively large depth from the top surface with high doping concentration. The dopant can be either N-type or P-type dopants depending on practical design considerations of the specific application. The gate area 164 is of a relatively small depth from the top surface. The gate area 164 is further disposed between and extending thereunto the source area 165 and the drain area 170. The gate area 164 further includes a current enhancement region 155 being doped with relatively lower dopant concentration and extending between the gate area 164 and the source area 165. Again, the dopants can be either of N-type or P-type dopants most suitable for specific implementations. The current enhancement region 155 is a region of less depth from the top surface doped with both depletion implantation and enhancement implantation. The gate area 164 further includes a breakdown prevention region doped with a depletion implantation which a relatively less dopant concentration. The breakdown prevention region extends between the gate 135 and the drain area 170.

This novel power MESFET device 100 shown in FIG. 3 has several advantageous features. First, the conductive channel between the source electrode 115 and the gate electrode 120, i.e., the gate area 164, is now a conductive region composed of twice implanted zones, i.e., the enhancement implemented region 155 and the depletion implanted region 160. Higher drain to source current can be generated now because the higher dopant concentration in this conductive channel. On the other hand, the channel between the gate electrode 120 and the drain electrode 125 is a channel comprises only depletion implanted region 160. The MESFET device 100 has a high drain breakdown voltage because of this configuration due to the fact that there is only a relatively lightly doped depletion implanted region 160 serves as active channel between the drain electrode 125 and the gate electrode 120. The structure of the MESFET device 100 near the gate electrode 120 and the drain electrode 125 can resist a higher level of reverse voltage which causes the drain breakdown voltage to increase.

Figure 4A:
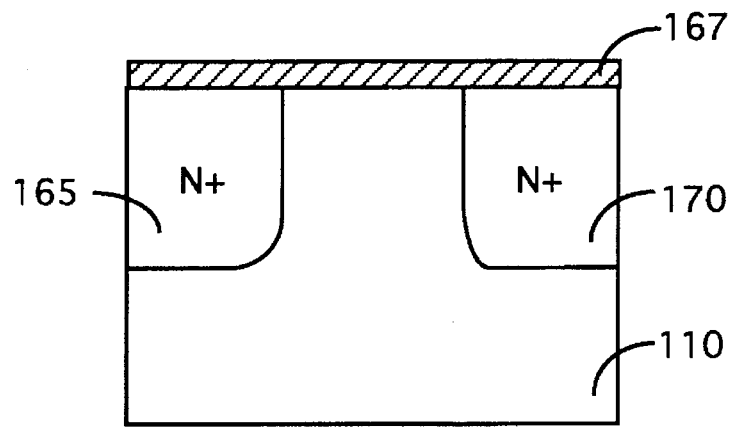
FIG. 4A–4E are diagrams illustrating by sequential cross-sectional representations the process steps of the present invention in making the MESFET IC structure as shown in FIG. 3.

The GaAs power MESFET device 100 as shown in FIG. 3 is fabricated by the processing steps as described below with each step described sequentially with one of the pictures in FIGS. 4A to 4E. Referring to FIG. 4A, the fabrication process is initiated starting from a semi-insulating undoped or chromium doped GaAs substrate 110 upon which the active areas 165 and 170 of n-type conductivity is formed. This step consists of first forming a passivation surface layer 167 over the substrate 110 with a dielectric material such as silicon nitride (Si3N4). Photoresist patterns are then used to select the areas of substrate where the device active layer is to be formed wherein the n-plus type ions such as silicon is implanted directly into the resist free areas.

Figure 4B:
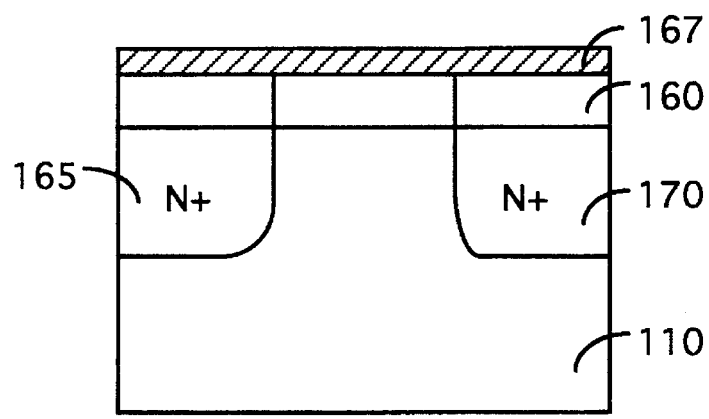

In the second step as shown in FIG. 4B, a depletion implantation over the entire active area of the MESFET device 100 is performed. The energy and dose of the ions implanted are chosen such that the semiconducting N-GaAs layer 160 as the result of this ion implantation operation is shallow having a depth of approximately 0.1 micron and has a dopant concentration in the range of about $10^{16}$ to $10^{17}$ atoms/cm$^3$.

Figure 4C:
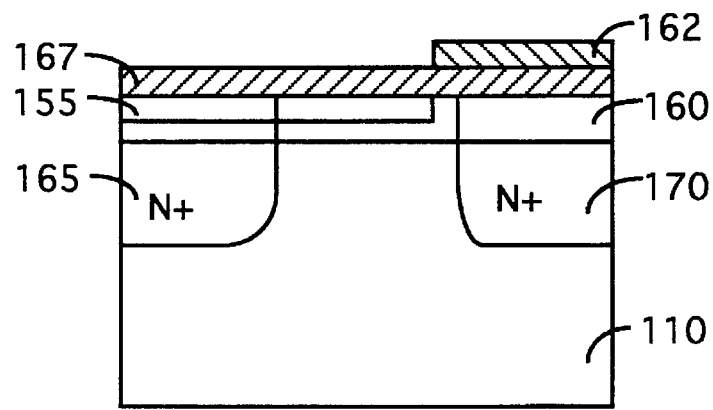

Next, referring to FIG. 4C, the right portion of the top area above the depletion implanted region 160 is covered with a photo-resist 162. Then a enhancement ion implantation is performed on the uncovered area to form an enhancement implanted region 155 on top of the depletion implanted region 160 over the left portion on the top surface of the MESFET device 100 where it is not covered by the photoresist 162. The enhancement ion implantation layer 155 has an dopant concentration in the range of $10^{16}$ to $10^{17}$ atoms/cm$^3$ with a layer thickness of approximately 0.1 microns.

Figure 4D:
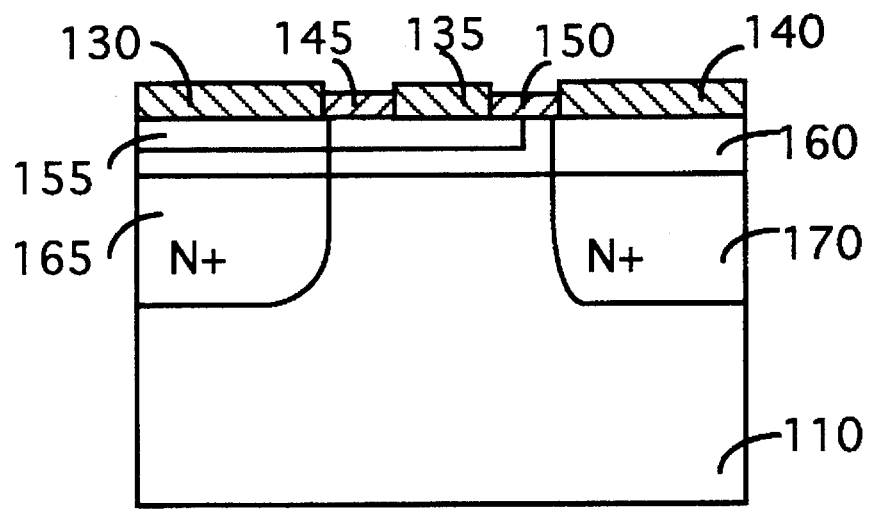
Figure 4E:
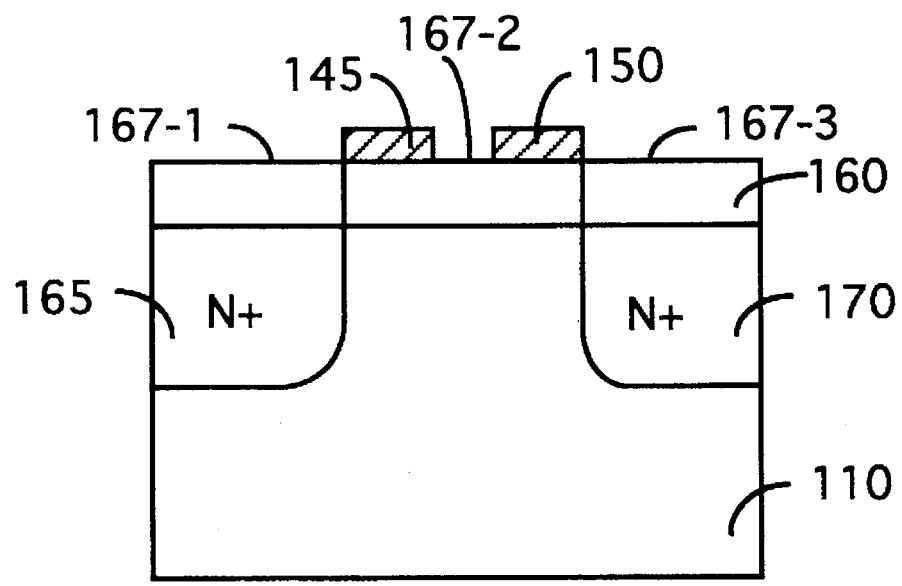

In the next step, referring to FIG. 4D, three areas, i.e., areas 167-1, 167-2, 167-3, on the: passivation surface layer 167 are removed. The remaining portion of the passivation surface layer 167 forms two separate silicon nitride barriers 145 and 150. Referring to FIG. 4E, the ohmic contacts 130 and 140 for the source and drain electrodes 115 and 125 respectively and the gate Schottky contact 135 are formed on the three areas where the passivation surface layer 167 is removed. The gate Schttoky contact 135 is placed with a little offset from the right edge of the enhancement implantation region 155.

A method for fabricating a metal semiconductor field effect transistor (MESFET) 100 with higher breakdown voltage and greater drain to source current is also disclosed in the present invention. The method for fabricating this power MESFET 100 comprises the steps of (a) forming a passivation dielectric layer on top of a semiconductor substrate; (b) forming two-large depth active areas under the dielectric layer by utilizing a photoresist for defining and implanting ions of a first conductivity with higher doping concentration into the active areas wherein one of the active areas being a source area and another a drain area; (c) forming a shallow depth low-doping gate channel by implanting the entire active area using a lower doping concentration with ions of the first conductivity; (d) defining a current enhancement region by employing a photoresist to cover the top surface above the source area and a small portion of contiguous top surface above the gate channel; (e) performing a shallow-depth low concentration enhancement ion implantation for the current enhancement region with ions of the first conductivity; (f) removing the photoresist from the top of the dielectric surface and remove the dielectric layer from a source ohmic contact area, a drain ohmic contact area, and a Schottky gate area; and (g) forming electric contacts on the source ohmic contact area, the drain ohmic contact area, and the Schottky gate area.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A method for fabricating a metal semiconductor field effect transistor (MESFET) comprising the steps of:

(a) forming a passivation dielectric layer on top of a semiconductor substrate;

(b) forming two active areas under said dielectric layer by utilizing a first photoresist for defining and implanting first ions of a first conductivity with a first doping concentration into said active areas wherein one of said active areas being a source area and another a drain area and said source area and said drain area being separated with a gate area;

(c) forming a gate channel by implanting second ions over said source area, said gate area and said drain area with a doping concentration lower than said first doping concentration wherein said second ions are of said first conductivity and said gate channel is shallower than said source area and said source area;

(d) defining a current enhancement region by employing a second photoresist to cover said drain area and a small portion of said gate channel contiguous to said drain area;

(e) performing an enhancement ion implantation with a doping concentration lower than said first doping concentration for forming the current enhancement region with third ions of said first conductivity wherein said current enhancement region being shallower than said source area and said drain area;

(f) removing said photoresist and remove said dielectric layer from a source ohmic contact area, a drain ohmic contact area, and a Schottky gate area; and (g) forming electric contacts on said source ohmic contact area, said drain ohmic contact area, and said Schottky gate area.

* * * * *